United States Patent
Lu et al.

(10) Patent No.: US 8,815,496 B2
(45) Date of Patent: *Aug. 26, 2014

(54) METHOD FOR PATTERNING A PHOTOSENSITIVE LAYER

(71) Applicant: Taiwan Semiconductor Manufacturing Company, Ltd., Hsin-Chu (TW)

(72) Inventors: Hsiao-Tzu Lu, Hsinchu (TW); Kuei Shun Chen, Hsin-Chu (TW); Tsiao-Chen Wu, Hsinchu County (TW); Vencent Chang, Hsinchu (TW); George Liu, Shin-Shu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/774,681

(22) Filed: Feb. 22, 2013

(65) Prior Publication Data

US 2013/0164686 A1 Jun. 27, 2013

Related U.S. Application Data

(63) Continuation of application No. 13/346,917, filed on Jan. 10, 2012, now Pat. No. 8,394,576, which is a continuation of application No. 11/861,064, filed on Sep. 25, 2007, now Pat. No. 8,124,323.

(51) Int. Cl.
*G03F 7/26* (2006.01)

(52) U.S. Cl.
USPC ............................. 430/314; 430/311; 430/327

(58) Field of Classification Search
USPC .......................................... 430/311, 313, 315
See application file for complete search history.

(56) References Cited

U.S. PATENT DOCUMENTS

| | | | | |
|---|---|---|---|---|
| 4,675,981 A | * | 6/1987 | Naruke | 438/298 |
| 4,898,837 A | * | 2/1990 | Takeda et al. | 438/332 |
| 8,124,323 B2 | * | 2/2012 | Lu et al. | 430/314 |
| 8,394,576 B2 | * | 3/2013 | Lu et al. | 430/314 |

* cited by examiner

*Primary Examiner* — Kathleen Duda
(74) *Attorney, Agent, or Firm* — Haynes and Boone, LLP

(57) ABSTRACT

The method of patterning a photosensitive layer includes providing a substrate including a first layer formed thereon, treating the substrate including the first layer with cations, forming a first photosensitive layer over the first layer, patterning the first photosensitive layer to form a first pattern, treating the first pattern with cations, forming a second photosensitive layer over the treated first pattern, patterning the second photosensitive layer to form a second pattern, and processing the first layer using the first and second patterns as a mask.

20 Claims, 6 Drawing Sheets

METHOD FOR PATTERNING A PHOTOSENSITIVE LAYER

PRIORITY DATA

The present application is a continuation application of U.S. patent application Ser. No. 13/346,917, filed Jan. 10, 2012, which is a continuation application of U.S. patent application Ser. No. 11/861,064, filed Sep. 25, 2007, now U.S. Pat. No. 8,124,323, each of which is hereby incorporated by reference in its entirety.

BACKGROUND

The present disclosure relates generally to semiconductor manufacture and, more particularly, to a method for patterning a photosensitive layer in semiconductor manufacture.

Photolithography is frequently used for forming the components of integrated circuits (IC). Generally, an exposure tool includes a photomask or reticle, through which light beams pass through and are focused by a projection lens onto a wafer, resulting in an image of device features in a photosensitive layer such as a photoresist layer formed on the wafer. There has been a continued increase in the density of devices that can be placed on a chip and as a result, the printing of device feature patterns with an extremely small pitch is required. However, there is a minimum pitch printing resolution limit that is determined by the wavelength of the light beam and the numerical aperture of the exposure tool. The pitch is the distance from one device feature to an adjacent device feature. If the pitch becomes too small, the projected image may be distorted by so called "proximity effects" that are associated with the diffraction of light. One method for forming such device features includes two photolithography processes and two etching processes. For example, a first mask is formed to provide a first pattern with substantially linear features. The substrate is then etched according to this first pattern to form substantially linear features. The first mask is then removed from the substrate. A second mask may then be formed to provide a second pattern for gaps in the previously formed substantially linear features. The substrate may then be etched according to this second pattern. The numerous steps required add costs to the fabrication including, for example, increased complexity of the processing and increased cycle time.

Therefore, what is needed is a simple and cost-effective method for patterning a photosensitive layer in semiconductor manufacture for process technologies of 45 nm and below.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
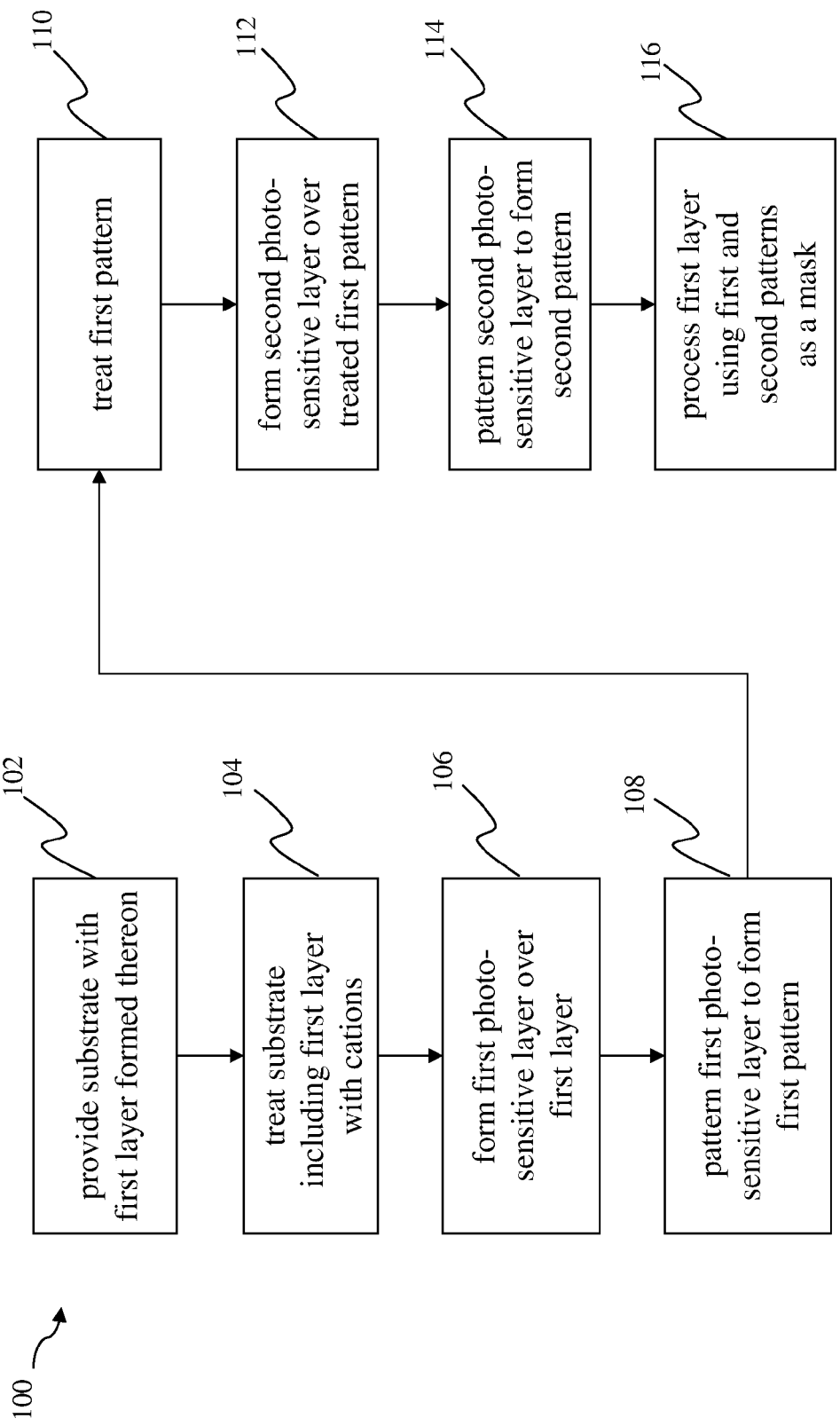
FIG. 1 is a flowchart for a method for patterning a photosensitive layer in semiconductor manufacture according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
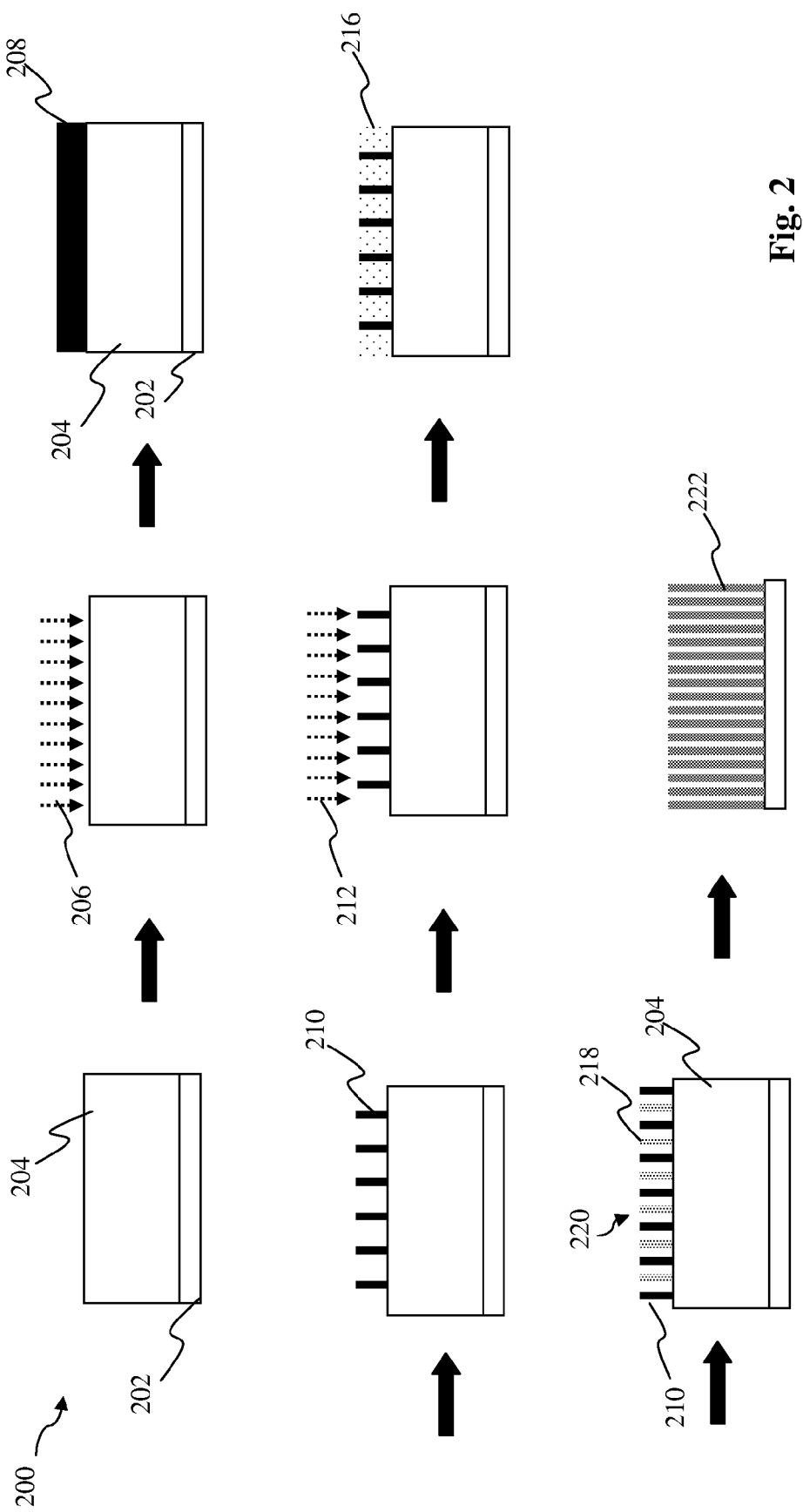
FIG. 2 is a diagrammatic view of a semiconductor device being processed according to the method of FIG. 1.

Referring to FIG. 1, illustrated is flowchart of a method 100 for patterning a photosensitive layer according to various aspects of the present disclosure. Also referring to FIG. 2, illustrated are diagrammatic views of a semiconductor device 200 being processed according to the method 100 of FIG. 1. The method 100 begins with step 102 in which a substrate 202 may be provided with a first layer 204 formed thereon. The substrate 202 may include an elementary semiconductor (such as crystal silicon, polycrystalline silicon, amorphous silicon and germanium), a compound semiconductor (such as silicon carbide and gallium arsenic), an alloy semiconductor (such as silicon germanium, gallium arsenide phosphide, aluminum indium arsenide, aluminum gallium arsenide and gallium indium phosphide) and/or combinations thereof. In other examples, compound semiconductor substrate may include a multiple silicon structure, or the silicon substrate may include a multilayer compound semiconductor structure. The substrate 202 may also include an epitaxial layer (epilayer) overlying a bulk semiconductor.

The first layer 204 may include a material layer to be processed and/or patterned to form various microelectronic features such as interconnect lines, contacts, vias, polygates, and other features known in the art. For example, the first layer 204 may include a silicon, silicon oxide ($SiO_2$), silicon oxynitride (SiON), organic material, conductive material, low-k dielectric material, and other suitable material. The first layer 204 may be formed by chemical vapor deposition (CVD), spin coating, or other suitable techniques known in the art. Additionally, an anti-reflective coating (ARC) (not shown) including a bottom anti-reflective coating (BARC) layer may be formed over the substrate 202. The use of the BARC layer in advance photolithography enhances the control of critical dimensions (CD) by suppressing reflective notching, standing wave effects, and a swing ratio caused by thin film interference.

The method 100 continues with step 104 in which the substrate 202 including the first layer 204 may be treated 206 with cations. The cations may be provided by performing a cation implantation process. The implantation process may implant cations to the surface of the first layer 204. The cations may include B cations. Alternatively, the cations may optionally include H cations. Further, the cations may include elements such as Al, Ga, In, N, P, As, Sb, C, Si, Ge, Sn, and also including their compounds. The dosage of implanted cations may range from about $1e^9$ to about $1e^{15}$ cm$^{-2}$. The implantation energy may range from about 1 to about 1M keV. The above-described ion implantation settings are given merely as examples and should not be used to unduly limit the scope and application of this process.

Alternatively, the substrate 202 including the first layer 204 may optionally be treated 206 by performing a cation plasma treatment under suitable conditions. A number of suitable plasma gases may be used, such as gases including B cations. Alternatively, the gases may optionally include H cations. Further, the gases may include other suitable cations such as He, C, N, O, F, Cl, Br, Ne, Ar, and also including their compounds. The frequency for the plasma treatment may range from about 10 to about 200 MHz. The reaction power of the plasma chamber may range about 100 to about 3000 Watts. The above-described plasma treatment settings are given merely as examples and should not be used to unduly limit the scope and application of this process.

The method 100 continues with step 106 in which a first photosensitive layer 208 may be formed over the first layer 204. The treatment with the cations from the previous step 104 has been observed to increase adhesion between the first photosensitive layer 208 and the first layer 204 and thus, improving the photolithography process that follows below. The first photosensitive layer 208 may include a photoresist or resist layer. The resist may include a positive or negative type resist. The first photosensitive layer 208 may be formed by spin coating or other suitable process. Alternatively, the first photosensitive layer 208 may optionally be treated with cations as discussed above.

The method 100 continues with step 108 in which the first photosensitive layer 208 may be patterned to form a first pattern 210. The first photosensitive layer 208 may be patterned by a photolithography process including soft-baking, exposure, post-baking, developing, rinsing, drying, and other suitable processes. The photolithography process is known in the art and thus, not described in detail herein. Additionally, the photolithography process may optionally include an immersion lithography process. The first pattern 210 may include a line pattern configured to form interconnects lines. The line pattern may include a pitch that may be limited by a printing resolution of the photolithography system. The pitch corresponds to the spacing between adjacent lines in the line pattern. The printing resolution may be limited by various factors such as the wavelength of the radiation source and configuration of the lens system.

The method 100 continues with step 110 in which the first pattern 210 may be treated 212 to form a static layer. The first pattern 210 may be treated and stabilized so that subsequent processing as described below does not adversely alter the first pattern. The static layer of the first pattern 210 may be formed by various techniques. For example, the static layer may be formed by a cation implantation process similar to the process disclosed in step 104. Alternatively, the static layer may optionally be formed by a cation plasma treatment similar to the process disclosed in step 104. Further, the static layer may also be formed by UV curing, baking, and/or E-beam processing.

The method 100 continues with step 112 in which a second photosensitive layer 216 may be formed over the substrate 202. The second photosensitive layer 216 may be similar to the first photosensitive layer 208. The second photosensitive layer 216 may be formed by a spin coating or suitable process. As such, the second photosensitive layer 216 substantially covers the first layer 204 including gaps within the first pattern 210.

The method 100 continues with step 114 in which the second photosensitive layer 216 may be patterned to form a second pattern 218. The second photosensitive layer 216 may be patterned by a photolithography process similar to the one disclosed in previous step 108. The second pattern 218 may also include a line pattern with lines disposed within the gaps of the first pattern 210. The second pattern 218 may include a pitch that is similar to the first pattern 210. Accordingly, the first pattern 210 and second pattern 218 may combine to form a final pattern 220 that has a pitch that is substantially one-have the pitch of the first pattern and/or second pattern. The method 100 continues with step 116 in which the first layer 204 may be processed using the first pattern 210 and second pattern 218 as a photomask or mask. For example, the first layer 204 may be etched to form a final line pattern 222 on the substrate 202. Thus, the method 100 can be implemented for forming features in 45 nm and below process technologies with current photolithography equipment and materials.

Figure 3:
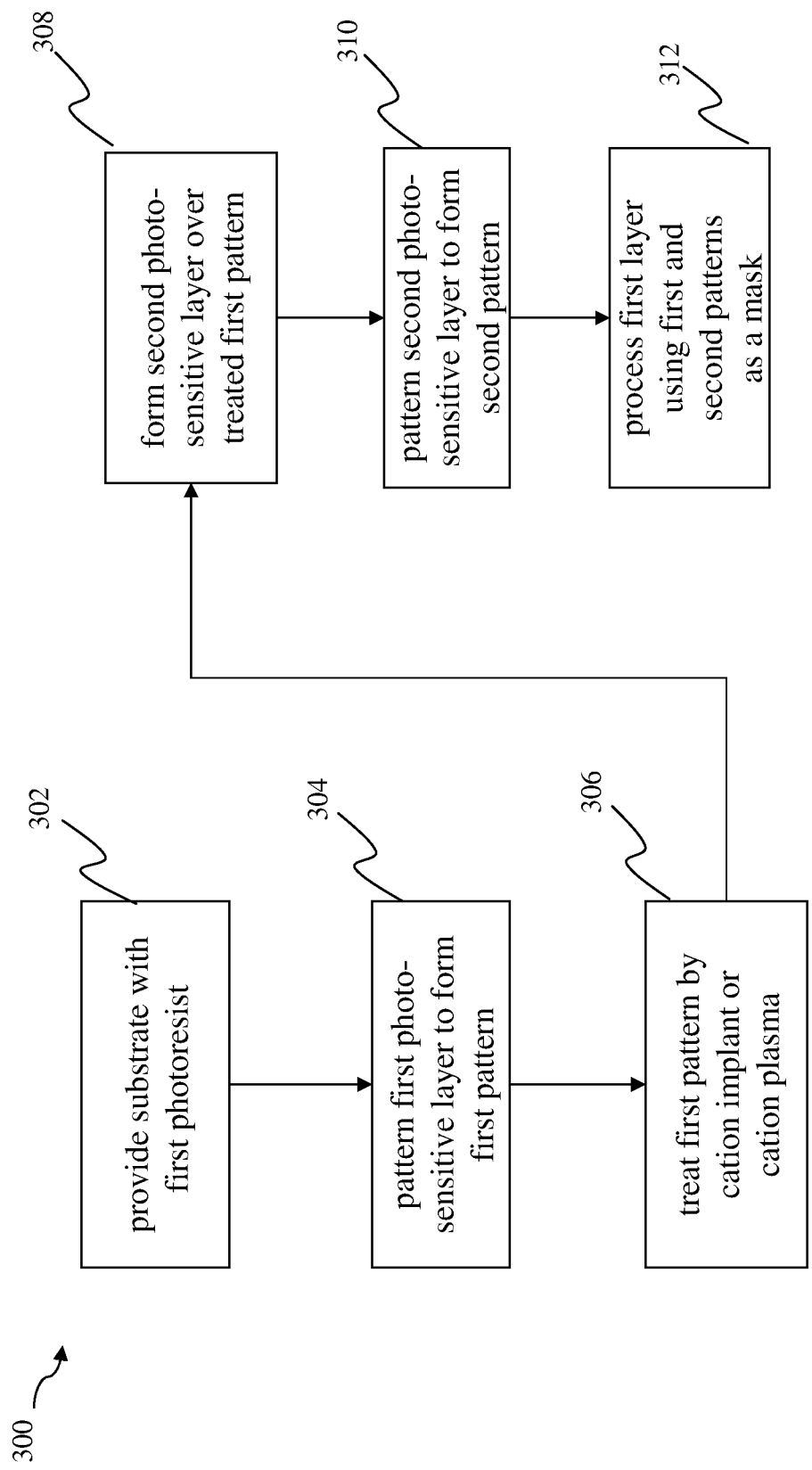
FIG. 3 is a flowchart of an alternative method for patterning a photosensitive layer in semiconductor manufacture according to various aspects of the present disclosure.
Figure 4:
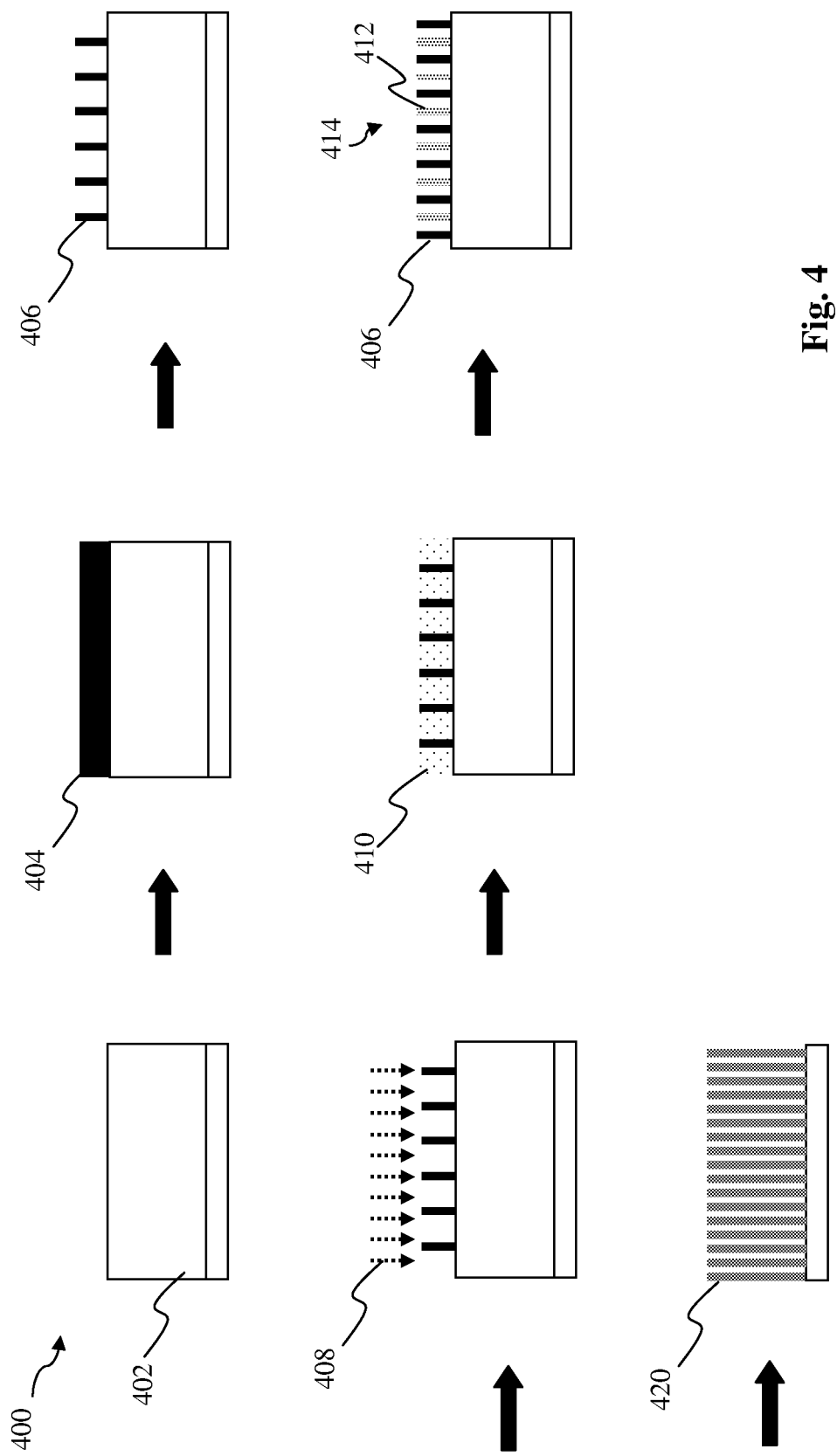
FIG. 4 is a diagrammatic view of a semiconductor device being processed according to the method of FIG. 3.

Referring to FIG. 3, illustrated is a flowchart of a method 300 for patterning a photosensitive layer according to various aspects of the present disclosure. Also referring to FIG. 4, illustrated are diagrammatic views of a semiconductor device 400 being processed according to the method 300 of FIG. 3. The method 300 begins with step 302 in which a substrate 402 may be provided with a first photosensitive layer 404 formed thereon. The substrate 402 may be similar to the substrate 202 of FIG. 2. The substrate 402 may include a process layer to be processed to form various device features such as interconnect lines, contacts, vias, gate electrodes, doped regions, and other features known in the art. For example, the process layer may include a silicon, silicon oxide (SiO2), silicon oxynitride (SiON), organic material, conductive material, low-k dielectric material, and other suitable material. Additionally, an anti-reflective coating (ARC) (not shown) including a bottom anti-reflective coating (BARC) layer may be formed over the substrate 202. The use of the BARC layer in advance photolithography enhances the control of critical dimensions (CD) by suppressing reflective notching, standing wave effects, and a swing ratio caused by thin film interference.

The first photosensitive layer 404 may include a photoresist or resist layer. The resist may include a positive or negative type resist. The first photosensitive layer 404 may be formed by spin coating or other suitable process. The method 300 continues with step 304 in which the first photosensitive layer 404 may be patterned to form a first pattern 406. The first photosensitive layer 404 may be patterned by a photolithography process including soft-baking, exposure, post-baking, developing, rinsing, drying, and other suitable processes. The photolithography process is known in the art and thus, not described in detail herein. Additionally, the photolithography process may optionally include an immersion lithography process. The first pattern 406 may include a line pattern similar to the line pattern in FIG. 2.

The method 300 continues with step 306 in which the substrate 402 including the first pattern 406 may be treated 408 with cations. The first pattern 406 may be treated and stabilized so that subsequent processing as described below does not adversely alter the first pattern. The cations may be provided by performing a cation implantation process. The implantation process may implant cations to the surface of the substrate 402 including the first pattern 406. The cations may include B cations. Alternatively, the cations may optionally include H cations. Further, the cations may include elements such as Al, Ga, In, N, P, As, Sb, C, Si, Ge, Sn, including their compounds. The dosage of implanted cations may range from about $1e^9$ to about $1e^{15}$ cm$^{-2}$, for example. The implantation energy may range from about 1 to about 1 MkeV, for example. The above-described ion implantation settings are given merely as examples and should not be used to unduly limit the scope and application of this process.

Alternatively, the substrate 402 including the first pattern 406 may optionally be treated 408 by performing a cation plasma treatment under suitable conditions. A number of suitable plasma gases may be used, such as gases including B cations. Alternatively, the gases may optionally include H cations. Further, the gases may include other suitable cations such as He, C, N, O, F, Cl, Br, Ne, Ar, including their compounds. The frequency for the plasma treatment may range from about 10 to about 200 MHz. The reaction power of the plasma chamber may range about 100 to about 3000 Watts. The above-described plasma treatment settings are given merely as examples and should not be used to unduly limit the scope and application of this process.

The method 300 continues with step 308 in which a second photosensitive layer 410 may be formed over the substrate 402. The second photosensitive layer 410 may be similar to the first photosensitive layer 404. The second photosensitive layer 410 may be formed by a spin coating or suitable process. As such, the second photosensitive layer 410 substantially covers the substrate 402 including gaps within the first pattern 406.

The method 300 continues with step 310 in which the second photosensitive layer 408 may be patterned to form a second pattern 412. The second photosensitive layer 408 may be patterned by a photolithography process similar to the one disclosed in previous step 304. The second pattern 412 may also include a line pattern with lines disposed within the gaps of the first pattern 406. The second pattern 412 may include a pitch that is similar to the first pattern 406. Accordingly, the first pattern 406 and second pattern 412 may combine to form a final pattern 414 that has a pitch that is substantially smaller (e.g., one-half) than the pitch of the first pattern and/or second pattern. The method 300 continues with step 312 in which the substrate 402 may be processed using the first pattern 406 and second pattern 412 as a photomask or mask. For example, the substrate 402 may be etched to form a final line pattern 420. Thus, the method 300 can be implemented for forming features in process technologies of 45 nm and below with current photolithography equipment and materials.

Figure 5:
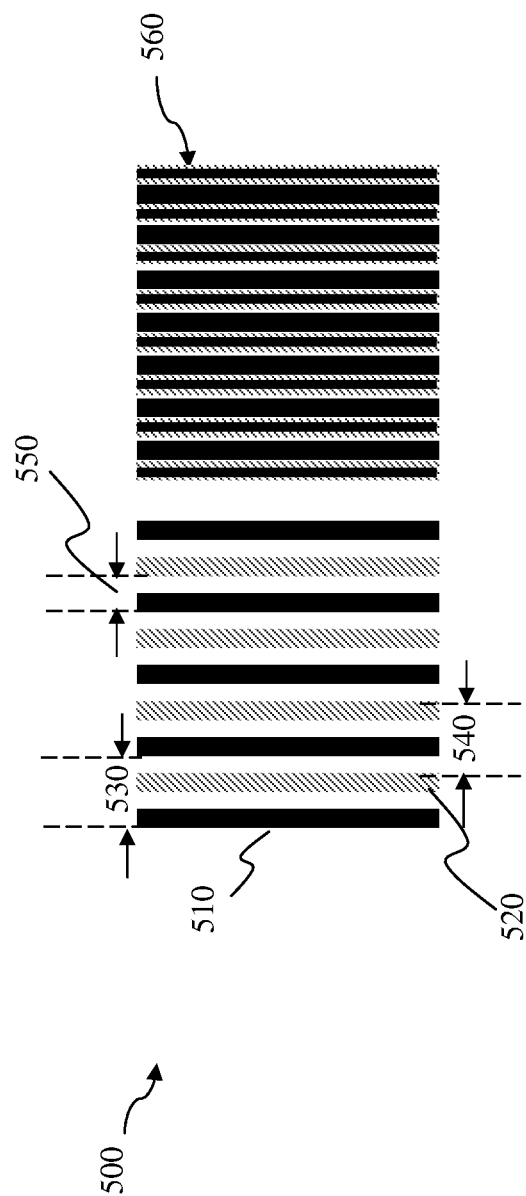
FIG. 5 is a top view of a line pattern that may be formed by the methods of FIGS. 1 and 3.

Referring to FIG. 5, illustrated is a top view of a line pattern 500 that may be formed in a photosensitive layer by the methods 100 and 300 of FIGS. 1 and 3, respectively. The line pattern 500 includes a first line pattern 510 and a second line pattern 520. The first line pattern 510 includes parallel lines that have a first pitch 530, and the second line pattern 520 includes parallel lines that have a second pitch 540. By combining the first 510 and second 520 line patterns, the line pattern 500 includes a pitch 550 that is smaller than the first 530 and second 540 pitches. It has been observed that the methods 100 and 300 are capable of forming a line pattern 560 on a substrate that has a pitch of about 80 nm including line widths of about 45.5 nm.

Figure 6:
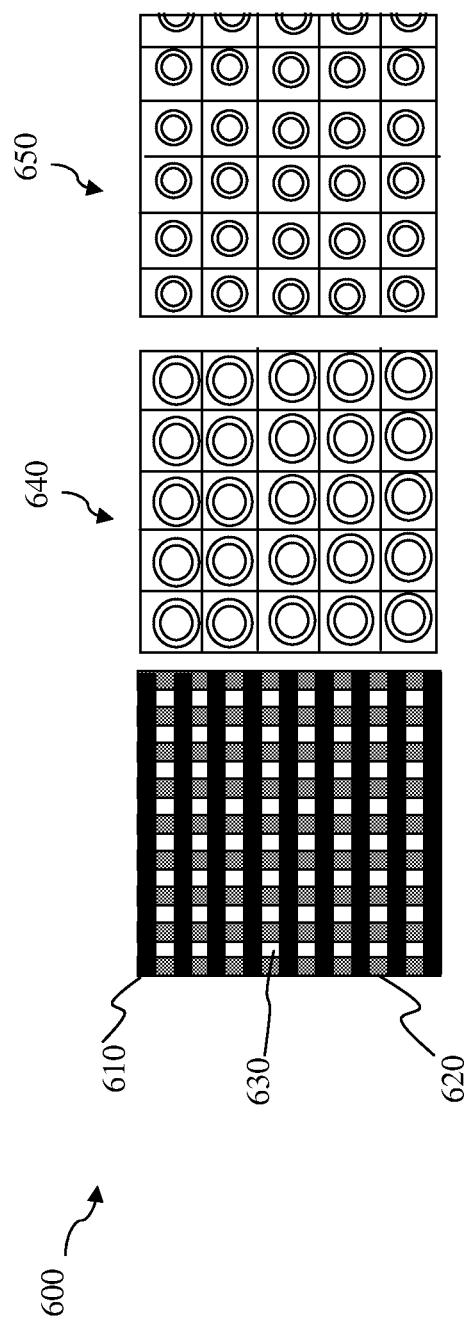
FIG. 6 is a top view of a hole pattern that may be formed by the methods of FIGS. 1 and 3.

Referring to FIG. 6, illustrated is a top view of a hole pattern 600 that may be formed in a photosensitive layer by the methods of 100 and 300 of FIGS. 1 and 3, respectively. The hole pattern 600 includes a first line pattern 610 and a second line pattern 620. The first line pattern 610 includes parallel lines in a first direction, and the second line pattern 620 includes parallel lines in a second direction that is perpendicular to the first direction. By combining the first 610 and second 620 line patterns, the hole pattern 600 includes openings 630 that are created in gaps of the first and second line patterns. As such, an underlying material layer such as a dielectric layer may be etched using the hole pattern 600 as a photomask or mask to form holes in the dielectric layer for contacts, vias, or other suitable features. It has been observed that the methods 100 and 300 are cable of forming a hole pattern 640 that has a pitch of about 110 nm including holes with a critical dimension (CD) of about 52.6 nm, and/or a hole pattern 650 that has a pitch of about 100 nm including holes with a CD of about 41.2 nm.

In summary, the present disclosure provides a method for patterning a photosensitive layer in semiconductor manufacture which includes the steps of: providing a substrate including a first layer formed thereon; treating the substrate including the first layer with cations; forming a first photosensitive layer over the first layer; patterning the first photosensitive layer to form a first pattern; treating the first pattern with cations; forming a second photosensitive layer over the treated first pattern; patterning the second photosensitive layer to form a second pattern; and processing the first layer using the first and second patterns as a mask. In some embodiments, the steps of treating the substrate including the first layer with cations and treating the first pattern with cations include performing a cation implantation process. In other embodiments, the cation implantation process utilizes cations selected from the group consisting of: B, H, Al, Ga, In, N, P, As, Sb, C, Si, Ge, and Sn. In some other embodiments, the cation implantation process includes a dosage between 1 E9 to about 1E15-cm$^2$. In still other embodiments, the cation implantation process includes an energy between 1 keV to about 1M keV.

In other embodiments, the steps of treating the substrate including the first layer with cations and treating the first pattern with cations include performing a cation plasma treatment. In some other embodiments, the cation plasma treatment utilizes cations selected from the group consisting of: B, H, He, C, N, O, F, Cl, Br, Ne, and Ar. In other embodiments, the step of providing the substrate including the first layer includes configuring the first layer to be selected from the group consisting of: silicon, silicon oxide, silicon oxynitride, organic material, conductive material, and low-k dielectric material. In still other embodiments, the step of processing the first layer using the first and second patterns as the mask includes etching the first layer to form a line pattern. In some other embodiments, the step of processing the first layer using the first and second patterns as the mask includes etching the first layer to form a hole pattern. In other embodiments, the step of providing the substrate including the first layer further includes providing an anti-reflective coating (ARC) over the first layer.

In another embodiment, a method for fabricating a semiconductor device includes the steps of: providing a substrate; forming a first photosensitive layer over the substrate; treating the first photosensitive layer with cations; patterning the first photosensitive layer to form a first pattern over the substrate; treating the first pattern with cations; forming a second photosensitive layer over the substrate and the first pattern; patterning the second photosensitive layer to form a second pattern over the substrate; and processing the substrate using the first and second patterns as a mask. The step of treating the first photosensitive layer and the first pattern with cations includes performing a cation implantation process or by performing a cation plasma process. In some embodiments, the step of treating the first photosensitive layer and the first pattern with cations includes treating the first photosensitive layer and first pattern with boron cations or hydrogen cations. In some other embodiments, the cation implantation process utilizes elements selected from the group consisting of: Al, Ga, In, N, P, As, Sb, C, Si, Ge, and Sn. In still other embodiments, the cation plasma process utilizes elements selected from the group consisting of: He, C, N, O, F, Cl, Br, Ne, and Ar. In other embodiments, the step of providing the substrate further includes providing an anti-reflective coating (ARC) over the substrate.

In yet another embodiment, a method is provided for semiconductor manufacturing which includes the steps of: providing a substrate including a process layer formed thereon; treating the substrate including the process layer by performing one of a cation implantation process and a cation plasma process; forming a first photoresist layer over the process layer; patterning the first photoresist layer to form a first pattern; treating the first pattern; forming a second photoresist layer over the substrate and the first pattern; patterning the second photoresist layer to form a second pattern; and etching the process layer using the first and second patterns as a mask. In some embodiments, the cation implantation process utilizes cations selected from the group consisting of: B, H, Al, Ga, In, N, P, As, Sb, C, Si, Ge, and Sn. In some other embodiments, the cation plasma process utilizes cations selected from the group consisting of: B, H, He, C, N, O, F, Cl, Br, Ne, and Ar. In still other embodiments, the treating the first pattern includes treating the first pattern by performing one of an implant process, a plasma process, an UV curing process, an e-beam process, and a baking process.

Aspects of the present disclosure are best understood from the following above description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

Several different advantages exist with these and other embodiments disclosed in the present disclosure. In addition to providing a method for patterning a photosensitive layer that may be implemented even as process technologies progress to 45 nm and below, the method disclosed herein does not require advance photolithography techniques and/or photosensitive materials. Also, the method disclosed herein utilizes a double exposure and single etch process to pattern features thereby, reducing the complexity and costs of fabricating semiconductor devices. The method disclosed herein may form line and/or hole patterns that have improved profiles and critical dimension uniformity.

What is claimed is:

1. A method comprising:
    treating a substrate with a first cation selected from the group consisting of B, H, Al, Ga, In, N, P, As, Sb, C, Si, Ge, Sn, He, F, Br, Ne, and Ar;
    after treating the substrate with the first cation, forming a patterned first material layer over the substrate;
    treating the patterned first material layer with a second cation selected from the group consisting of B, H, Al, Ga, In, N, P, As, Sb, C, Si, Ge, Sn, He, F, Br, Ne, and Ar;
    forming a patterned second material layer over the substrate; and
    processing the substrate using the first and second patterns as a mask.

2. The method of claim 1, wherein the patterned first material layer includes a first photoresist material and the patterned second material layer includes a second photoresist material.

3. The method of claim 1, wherein the wherein the patterned first material layer is different from the patterned second material.

4. The method of claim 1, further comprising forming a third material layer over the substrate prior to forming the patterned first material layer over the substrate.

5. The method of claim 4, wherein the third material layer includes at least one of silicon, silicon oxide, silicon oxynitride, organic material, conductive material, and low-k dielectric material.

6. The method of claim 1, wherein the patterned first material layer includes a first pitch and the patterned second material layer includes a second pitch, wherein the first and second pitches are substantially similar.

7. A method comprising:
    treating a substrate with a first cation selected from the group consisting of B, H, Al, Ga, In, N, P, As, Sb, C, Si, Ge, Sn, He, F, Br, Ne, and Ar;
    after treating the substrate with the first cation, forming a first photosensitive layer over the substrate;
    patterning the first photosensitive layer to form a first pattern;
    treating the first pattern with a second cation selected from the group consisting of Boron and Hydrogen;
    forming a second photosensitive layer over the first pattern;
    patterning the second photosensitive layer to form a second pattern; and
    processing the substrate using the first and second patterns as a mask.

8. The method of claim 7, further comprising:
    forming a second photosensitive layer over the first pattern; and
    patterning the second photosensitive layer to form a second pattern.

9. The method of claim 7, wherein treating the first pattern with the first cation selected from the group consisting of Boron and Hydrogen includes performing one of a cation implantation process and a plasma treatment.

10. The method of claim 7, forming a material layer over the substrate prior to forming the first photosensitive layer over the substrate such that the first photosensitive layer is formed over the material layer, wherein the material layer includes at least one of silicon, silicon oxide (SiO2), low-k dielectric material, organic material, conductive material, and silicon oxynitride (SiON).

11. The method of claim 7, wherein forming the second photosensitive layer over the first pattern includes forming the second photosensitive layer over the first pattern after treating the first pattern with the second cation.

12. The method of claim 7, wherein treating the first pattern with the second cation selected from the group consisting of Boron and Hydrogen includes selecting Hydrogen as the second cation such that the first pattern is treated with Hydrogen.

13. A method comprising:
- treating a substrate with a first cation selected from the group consisting of B, H, Al, Ga, In, N, P, As, Sb, C, Si, Ge, Sn, He, F, Br, Ne, and Ar;
- after treating the substrate with the first cation, forming a patterned first photosensitive layer over the substrate;
- treating the patterned first photosensitive layer with a second cation;
- forming a patterned second photosensitive layer over the substrate; and
- processing the substrate using the first and second patterns as a mask.

14. The method of claim 13, wherein second cation is selected from the group consisting of B, H, Al, Ga, In, N, P, As, Sb, C, Si, Ge, Sn, He, F, Br, Ne, and Ar.

15. The method of claim 13, wherein the patterned first photosensitive layer is different than the patterned second photosensitive layer.

16. The method of claim 13, wherein the treating the substrate with the first cation includes performing one of a cation implantation process and a cation plasma process.

17. The method of claim 13, further comprising forming a material layer over the substrate prior to treating the patterned first photosensitive layer with the first cation, the material layer being different from the first photosensitive layer.

18. The method of claim 17, wherein the material layer includes at least one of silicon, silicon oxide, silicon oxynitride, organic material, conductive material, and low-k dielectric material.

19. The method of claim 13, wherein forming the patterned first photosensitive layer over the substrate includes:
- forming a first photosensitive layer over the substrate;
- treating the first photosensitive layer over the substrate with a third cation selected from the group consisting of B, H, Al, Ga, In, N, P, As, Sb, C, Si, Ge, Sn, He, F, Br, Ne, and Ar; and
- patterning the treated first photosensitive layer to form the patterned first photosensitive layer over the substrate.

20. The method of claim 13, wherein processing the substrate using the first and second patterns as the mask includes etching the substrate using the first and second patterns as the mask.

* * * * *